March 27, 1973 J. F. PODELL ET AL 3,723,258
USE OF ANODIZED ALUMINUM AS ELECTRICAL INSULATION AND SCRATCH PROTECTION FOR SEMICONDUCTOR DEVICES
Filed Dec. 14, 1970 2 Sheets-Sheet 1

INVENTORS
JACK F. PODELL
ROBERT M. WHELTON
BY Alan H. MacPherson
ATTORNEY

March 27, 1973 J. F. PODELL ET AL 3,723,258

USE OF ANODIZED ALUMINUM AS ELECTRICAL INSULATION AND SCRATCH PROTECTION FOR SEMICONDUCTOR DEVICES

Filed Dec. 14, 1970 2 Sheets-Sheet 2

INVENTORS
JACK F. PODELL
ROBERT M. WHELTON

BY Alan H. MacPherson
ATTORNEY

United States Patent Office 3,723,258

Patented Mar. 27, 1973

3,723,258

USE OF ANODIZED ALUMINUM AS ELECTRICAL INSULATION AND SCRATCH PROTECTION FOR SEMICONDUCTOR DEVICES

Jack F. Podell, Palo Alto, and Robert M. Whelton, Sunnyvale, Calif., assignors to Fairchild Camera and Instrument Corporation, Mountain View, Calif.

Filed Dec. 14, 1970, Ser. No. 97,828

Int. Cl. B01k *2/02;* C23b *5/46, 5/48*

U.S. Cl. 204—15 3 Claims

ABSTRACT OF THE DISCLOSURE

Multiple layers of conductive interconnects are formed on an integrated circuit by depositing layers of a metal (typically aluminum) on the surface of the circuit and then selectively anodizing these layers to form insulation layers or layers of conductive interconnects. Masking material is used to prevent the anodization of, and thus to define, the conductive lead patterns.

BACKGROUND OF THE INVENTION

Field of the invention

This invention relates to semiconductor devices and in particular to the use of anodized metal to form interconnective lead patterns, insulation layers, and scratch resistant surfaces on single layer and multi-layer semiconductor devices.

Prior art

Anodization of metals, and particularly of aluminum, is old. Anodized aluminum has been used as the dielectric in capacitors, and as an insulating barrier in semiconductor packages.

Integrated circuits consist of a large number of active and passive semiconductor regions on a single semiconductor chip. These regions are inter-connected by conducting paths, usually metal, placed over, and insulated from, one surface of the semiconductor material. To achieve flexibility in the circuits produced by interconnecting the semiconductor regions formed within the semiconductor chip, two or more layers of metal interconnects are sometimes formed on a semiconductor chip. The first metal layer is formed over an insulating layer and contacts portions of the underlying regions in the semiconductor chip which are exposed through openings in the insulation. Next, typically a layer of insulation is formed over the first metal interconnect layer and a second interconnect layer, which contacts the first interconnect layer through openings formed in the intermediate insulation, is formed over this layer of insulation. More than two interconnect layers can be formed, if desired.

One problem with such dual-layer or multi-layer circuits is that the insulation formed over the first metal layer often is extremely thin or missing, particularly at the edges of the metal path forming the first interconnect layer. To overcome this problem, metal interconnect layers with sloping sides and rounded edges have been developed. Such interconnect layers are disclosed in U.S. Pat. No. 3,586,922, issued June 22, 1971, to Fairchild Camera and Instrument Corporation, the assignee of this application. While the structure proposed by Whelton and Johnson substantially eliminates unwanted short circuits between adjacent metal layers, the process requires the use of a special etch under carefully specified conditions. Moreover, even with the most careful control, often pin holes form in the insulation between adjacent metal layers thereby allowing the adjacent metal layers to contact each other through these pinholes. In addition, the surface of the device after several metal layers have been formed thereon is not planar in any sense of the word but rather contains ridges and depressions due to the piling-on and subsequent partial removal, in defined patterns, of several alternating layers of metal and insulation. Finally, in forming each of the metal interconnect and insulation layers, photo-resist masking and etching techniques are used. The etching must be carefully controlled to avoid the undesired removal of metal or insulation. Where this control is lacking, the yield of useful circuits from a semiconductor wafer drops.

To overcome all or some of these problems, it has been proposed to anodize those portions of the metal layer 21 (FIG. 2*a*) formerly etched away to render these portions non-conductive, leaving conductive strips of metal for the metal lead pattern. Tsunemitsu and Shiba, at Nippon Electric Company, Ltd. in Japan, on page 128 of the Proceedings of the International Electron Devices Meeting held Oct. 29, 30 and 31, 1969, in Washington, D.C. and sponsored by the IEEE Electron Devices Group, disclose a technique for doing this. To carry out the anodization. Tsunemitsu and Shiba first form a thin aluminum oxide non-porous film 23 (FIG. 2*b*) over those portions 25 of the aluminum layer 21 to remain conductive. Then they form a porous aluminum oxide by well-known anodization techniques in those portions 24 (FIG. 2*c*) of the aluminum 21 which formerly would have been removed by etching. The resulting structure is substantially planar and the technique lends itself to use with multi-layer interconnection patterns.

SUMMARY OF THE INVENTION

This invention, on the other hand, approaches the formation of a substantially planar multi-layer interconnect structure for use on an integrated circuit from a different point of view. Rather than use the prior art "strike" techniques to form a layer of non-porous aluminum oxide over those portions of the aluminum layer to remain conductive, this invention instead employs a direct masking technique using photo-resist to define the interconnect pattern in the aluminum. Direct masking reduces significantly the number of process steps required in the anodization process. The resulting process is simple in that no additional process steps are added compared to the steps currently used to produce multi-layer structures for use with integrated circuits. Surprisingly, photoresists and anodizing conditions have been found which minimize or prevent photoresist failure in the anodization solution. In addition, a technique has been found to avoid sideways anodization of the aluminum which commonly occurs in the absence of a strike as used in the prior art. The process of this invention yields a structure which is approximately or exactly planar, depending upon the conditions employed during the anodization.

According to this invention, a mask pattern identical to the interconnective lead pattern desired in the metal layer is placed on the metal using a selected material. Optionally, insulation is then placed on the backs and edges of the wafer. The wafer is then inserted into a carefully selected anodizing solution and a positive voltage is applied to the wafer. The cathode in the anodizing solution is held at a negative potential and a selected current is allowed to flow for a given time to anodize the unmasked portions of the metal. Anodization is complete when the wafer changes color. Anodized aluminum, for example, is transparent, and therefore the anodized portions of the wafer assume the darker colors of the substrate oxides. Upon completion of anodization, the wafer is removed from the anodizing solution.

In an alternate embodiment of this invention, the wafers being anodized are shunted by a piece of metal. Upon completion of the anodization, the anodizing current then flows through the shunt path, preventing sideways anodization from taking place on the wafers.

In still another embodiment of this invention, a selected portion of each wafer, typically the bottom third or quarter, is "pre-anodized" for a selected period of time in order to provide an electrical shunt during the subsequent anodization of the whole wafer.

In both of these alternative embodiments, the use of a conductive shunt path allows anodization current to be applied after the normal end of anodization on each wafer to ensure that all desired portions of the metal layers on the wafers are anodized.

DETAILED DESCRIPTION

This invention will first be described in terms of a complete process for anodizing a wafer using direct masking. Then, the influence of each important parameter in the process, such as anodization solution, anodization voltage, metal to be anodized, temperature of the anodization solution, photoresist employed for the direct masking, anodization current, and time required, will be discussed.

Figure 1A:
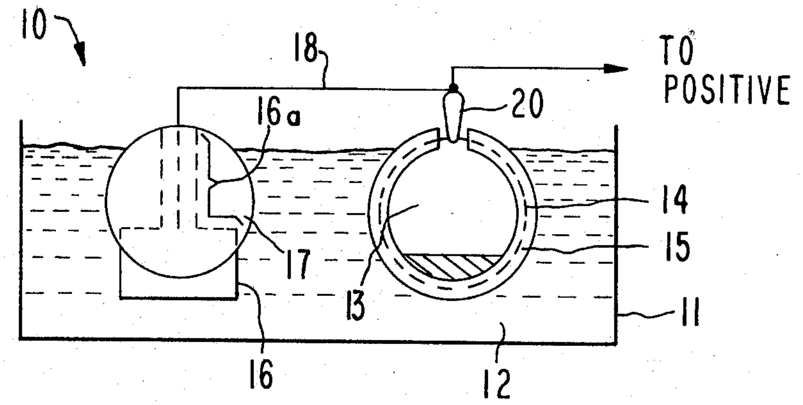
FIGS. 1*a* and 1*b* show side and front views of one wafer in an anodizing solution to illustrate the approximate dimensions and parameters of the process.

FIG. 1*a* shows the arrangement of the wafer to be anodized in the anodizing solution. The anodizing system 10 comprises a tank 11 containing anodizing solution 12. Wafer 13 is placed in solution 12. Wafer 13 (FIG. 1*c*) comprises semiconductor material 130 (typically, though not necessarily, silicon) containing a plurality of regions of selected conductivity types in the form of both active and passive components. For simplicity these regions are not shown in FIG. 1*c*. Overlying that surface 133 of substrate 130 through which at least some of these active and passive regions are diffused is a layer 131 of metal, typically aluminum. According to this invention, a conductive lead pattern is formed in layer 131 by anodizing those portions of layer 131 which formerly would have been removed from wafer 13. The regions of layer 131 to be anodized form a pattern complementary to the lead pattern defined by photo-resist 132 placed on the top surface of layer 131.

Prior to this invention, it was thought that a metal, and particularly aluminum, could not be anodized through direct masking. The main problem was the lifting of the masking material thereby preventing accurate control of the material to be anodized. According to this invention, it has been found that under certain conditions, certain masking materials will not be lifted by the anodization procedure. The resist AZ 1350H supplied by Shipley Co., Wellesley, Mass., was found to give satisfactory results under the greatest variety of anodization conditions.

Figure 1B:
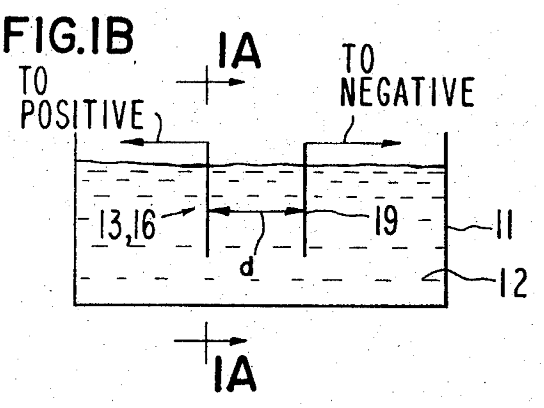
Figure 1C:
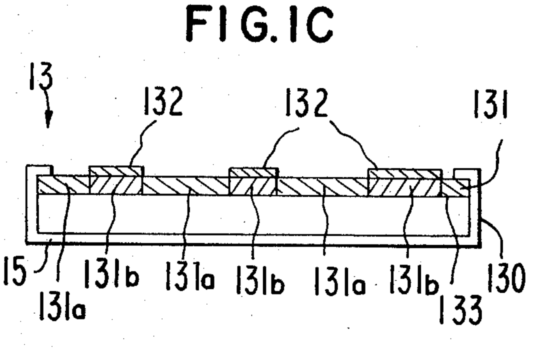
FIG. 1*c* shows a cross-sectional view of a wafer anodized by the process of this invention.
Figure 2A:
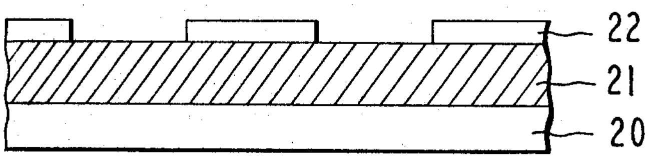
FIG. 2a PRIOR ART
FIGS. 2*a* through 2*c* illustrate the anodization of aluminum using the "strike" technique of the prior art.
Figure 2B:
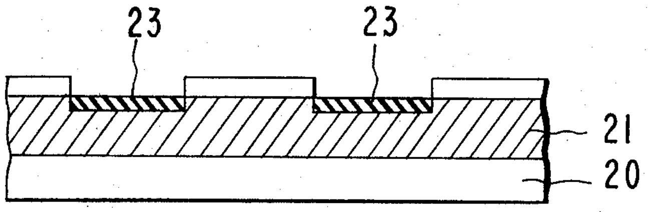
FIG. 2b PRIOR ART
Figure 2C:
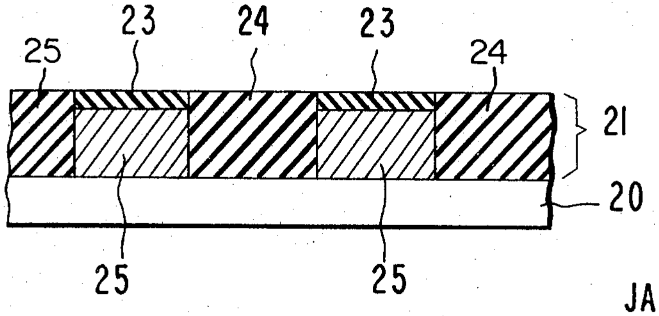
FIG. 2c PRIOR ART
Figure 3A:
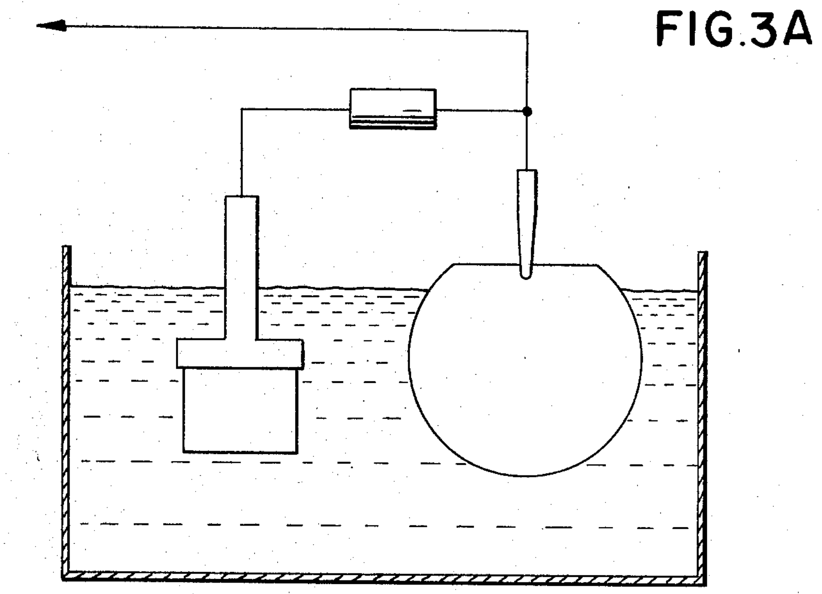
FIGS. 3*a* and 3*b* illustrate the arrangement used to anodize either a single wafer or a plurality of wafers using the technique of this invention.
Figure 3B:
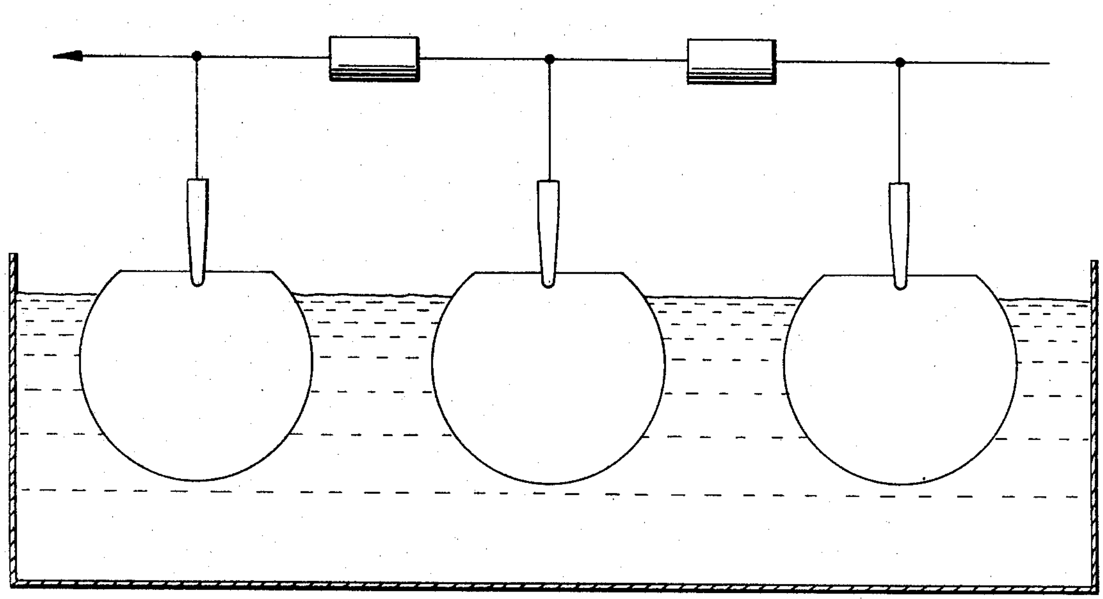

To carry out the anodization, insulation 15, such as an oxide of the semiconductor material, insulating tape or any other suitable insulation, is formed on, or applied to, the back side and over the edges of wafer 13, as shown in FIG. 1*c*. The wafer 13, so prepared, is placed in anodizing solution 12. Electrical contact is made to the wafer at one edge of the wafer. The electrical contact structure is used both to suspend the wafer in anodizing solution 12 and to apply a selected positive potential to the wafer. Although not essential to the practice of this invention, the positive potential can also be applied to a piece of aluminum 16 placed in shunt with wafer 13. By shunting anodizing current at the completion of anodization, this reduces somewhat the danger of overanodizing the wafer due to failure to remove the wafer at the proper time from the anodizing solution. All but the bottom portion of aluminum shunt 16 is masked by selected masking material 17, which might be insulating tape, for example, envelop the top portion **16*a* of aluminum 16 and thus prevent portion 16*a* from anodizing. Under some conditions anodization of portion 16*a* of shunt 16 can destroy the shunt. Lead 18 provides electrical contact from the positive voltage source to aluminum 16**.

As shown in FIG. 1*b*, the negative electrode 19 is located a select distance *d* from wafer 13 and metal 16. Distance *d* is typically about 1 to 1½ inches, although this distance is not critical.

As will be described later, in many cases a pre-anodization is used. The basic process, however, works also when the pre-anodization is omitted; thus this process will now be described briefly omitting the pre-anodization. To start the anodization, the power is turned on and the voltage is applied to the wafer. A typical voltage is approximately 50 volts. The current is set to zero. Wafer 13 and shunt aluminum 16, if used, are next placed in the anodizing solution, preferably a dilute phosphoric acid at approximately room temperature. Care is taken to assure that contact 20 to the wafer does not enter anodizing solution 12. This avoids a partial short-circuit which will prevent the aluminum layer 131 (FIG. 1*c*) on wafer 13 from anodizing.

The anodizing current required is a function of the area of aluminum to be anodized. In general, a current density on the order of 8 to 10 ma./cm.$^2$ is used initially although this density is not critical. When the process reaches steady state, the current density drops to about 4 to 6 ma./cm.$^2$ and remains at this level until the anodization is complete. Upon completion of anodization, the current density again drops to a lower value, typically around 3 ma./cm.$^2$, reflecting the higher impedance of the completely anodized wafer.

Anodization is complete when the wafer changes color. Anodized aluminum is transparent. Thus the anodized portions **131*a*** (FIG. 1*c*) of wafer 13 take on the darker colors of the substrate oxides. About 20 to 30 minutes are required to anodize one micron of aluminum in a 4% phosphoric acid solution at 24° C. with a power supply voltage of about 52.5 volts and a steady state anodizing current of about 4 to 6 ma./cm.$^2$. Continuation of the anodization for a few minutes beyond the end point in order to reduce the amount of aluminum layer 131 remaining unanodized in those portions **131*a* of layer 131 not covered by photo-resist 132, insures that the various aluminum leads beneath photo-resist 132** are not bridged or shorted by unanodized aluminum. At the end of anodization, the anodizing current is shut off. The application of a bright light during the last few minutes of anodizing helps to anodize the remaining aluminum. However, the reason for this is not fully understood.

The wafer 13 is removed from the anodizing solution and rinsed in deionized water. If desired, wafer 13 can be inspected under a microscope before removing the insulation 15. If too much unanodized aluminum remains, wafer 13 can be placed back into the anodizing solution, and the anodization can be continued until completed.

During anodization, bubbles form slowly on the surface of wafer 13. These bubbles slow down and in some cases are thought to prevent the anodization of metal layer 131 beneath them. These bubbles can be removed at various times during the anodization, if desired. To do this, the anodizing voltage and current are set to zero. Wafer 13 is removed from the anodizing solution, the bubbles are removed, and then the wafer is placed back into the anodizing solution. Anodizing current is then slowly increased, never exceeding 8 to 10 ma./cm.$^2$ while the anodizing voltage is allowed to climb back to its maximum level. When the voltage reaches its maximum value (in one embodiment 52.5 volts) anodizing current drops to 4 to 6 ma./cm.$^2$ and the anodization proceeds as before.

Alternatively, to increase somewhat the quality of ionization, a small portion of the wafer is pre-anodized before wafer 13 is submerged almost completely in anodizing solution 12 for complete anodization. Pre-anodization of a small portion of the wafer slows down the anodization of the remainder of the aluminum beneath the pre-anodized aluminum.

Shunt 16 (FIG. 1*a*) and the unanodized aluminum beneath the pre-anodized aluminum are alternate ways of ensuring that upon completion of the anodization of aluminum 131 (FIG. 1*c*) on wafer 13, the anodizing current is not forced to anodize those portions of aluminum 131 beneath photoresist 132. This prevents the anodizing current from continuing to anodize those portions of layer 131 to be retained as conductive leads or contacts if the wafer is left too long in the anodizing solution.

Anodization of wafers was satisfactorily completed in anodizing solution of ½, 1, 10, 19, 31, 50, 67 and 100% phosphoric acid (85% concentration). All of these anodizations successfully anodized those portions of aluminum layer 131 (FIG. 1*c*) on wafer 13 is not covered by resist 132.

However, the process is very sensitive to the phosphoric acid concentration. In 100% phosphoric acid, the anodization proceeds rapidly at a typical anodizing current of 80 milliamps with very low voltages on the order of 1 volt. With high phosphoric acid concentrations, little if any anodized aluminum remains in the field following the anodization, the anodized aluminum being removed by the anodizing solution almost as rapidly as it is formed. On the other hand, in very dilute solutions of phosphoric acid, such as ½ of 1% phosphoric acid, anodization proceeds slowly. To anodize a 1 micron layer of aluminum required 1 hour and 40 minutes. Even a solution of ⅓ of 1% phosphoric acid at 75° C. yielded good anodization.

Other anodization solution were substituted for phosphoric acid. Commonly, four anodizing solutions are used for the porous (soft) anodization of aluminum. Besides phosphoric acid, these are sulfuric acid, oxalic acid and chromic acid. Direct masking anodizations were attempted with these last three solutions. These anodizations were unsuccessful; the masking material lifted.

Anodizations were carried out at selected voltages between 5–110 volts. Successful anodizations were achieved over this range of voltages. At low voltages, anodization time becomes excessive but the masking resolution is maximized. At high voltages (i.e., above around 80 volts), there is an increased tendency of the masking material to "lift-off" from the aluminum, permitting the anodization of the underlying aluminum. Finally, above about 120 volts, destructive electric "sparking" (a high field breakdown of the thin, growing film of anodized aluminum film) occurs. However, as anodizing voltage is increased, the amount of "aluminum snow" in the anodized aluminum field decreases, becoming essentially none at 110 volts or greater. A high voltage anodization can be used advantageously where masking resolution is not critical, such as with a vapox mask.

As the voltage drops to and approaches zero, successful anodization of aluminum has been achieved. As the phosphoric acid concentration increases the rate at which the anodization occurs likewise increases.

In general, the weaker the anodization solution, the higher the anodizing voltage necessary to anodize a given thickness of aluminum in a given time. Alternatively, raising the temperature of the anodizing solution while the voltage is lowered allows one to achieve the same anodizing rate. Raising the anodizing solution concentration or temperature while the voltage is lowered improves the masking resolution at the expense of an increased amount of "aluminum snow" in the field. Raising the voltage reduces the amount of this "snow" in the field but makes more probable the lifting of the photoresist mask.

Anodizations were carried out at temperatures ranging from about 15° C. up to about 59° C. The rate of anodization is extremely temperature dependent. The anodization rate increases rapidly with temperature. A given thickness ($1\mu$) of aluminum anodized at 15° C. required about 1 hour and 15 minutes. As the temperature of the anodizing solution increases, the rate at which the anodized aluminum dissolves in the anodizing solution becomes about equal to the rate of formation of new anodized aluminum. Consequently, at the end of the process there is little or no anodized aluminum remaining in the field. However, anodization was done successfully at 75° C. in an anodizing solution of ⅓ of 1% phosphoric acid. At the other end of the temperature range, a solution of 50% phosphoric acid was used to anodize an aluminum layer on a wafer in an anodizing solution held at 5° C. Thus, anodizations can successfully be carried out in anodizing solutions ranging from just above freezing up to at least 75° C. Reducing the concentration of the anodizing solution as the temperature goes up compensates somewhat for the increasing tendency of a given concentration solution to etch away the newly anodized aluminum as soon as it is formed.

Anodization was attempted using a variety of photoresists. With KPR, the results were quite unsatisfactory. KMER and KTFR are better, and can be used successfully as anodization masks if the conditions are adjusted to carry out the anodizations at lower voltages than were customarily used in this work. Lower voltages are appropriate when the anodizing solution temperature or acid concentration, or both, are raised. AZ 1350, a lower viscosity version of AZ 1350H, was also tried but the results were marginal. The photoresist with which good results were achieved under the greatest variety of anodization conditions was AZ 1350H.

Anodization has been carried out successfully on aluminum containing up to 2% silicon therein. Analysis showed no significant difference between the anodized aluminum-silicon alloy or the anodized pure aluminum.

Key to the anodization process disclosed herein is the ability to control the anodization conditions so that the photoresist does not lift during the anodization process. This prevents the anodization of that aluminum under the photoresist. In one embodiment of this invention, assistance in achieving this was obtained by using a shunt circuit, consisting of a small piece of aluminum in parallel with the wafer or wafers to be anodized. The shunt circuit provides a path for anodizing current after the exposed portions of aluminum on the wafers have been completely anodized and thus draws away current which otherwise would anodize sideways the aluminum underneath the masking photoresist.

In addition to the shunt circuit, a mask that permits the anodization of the aluminum in the scribe lines on the underlying silicon wafer has advantages over a mask that protects the aluminum in the scribe lines. One theory for this is that after the aluminum in the scribe lines anodizes completely, the silcon under the aluminum starts to anodize and the continued anodization of the silicon effectively acts as a second shunt circuit preventing sidewise anodization of the aluminum under the photoresist pattern. This theory is unproven at this time, however.

Anodized aluminum has many uses in integrated circuit manufacture. First, anodized aluminum layers can be used to protect the top surface of the wafer. Secondly, an anodized aluminum layer or layers can be used as an insulation layer between adjacent metal lead patterns formed in a conventional manner. Third, anodized aluminum layers can form the interconnective patterns and the dielectric insulation between these patterns on a multilayer semiconductor device. Fourth, anodized aluminum forms the dielectric for capacitors. Fifth, anodized aluminum provides both an ion barrier and scratch-protection.

One embodiment of this invention uses a single evaporation to create the material from which the first layer of metal and overlying dielectric will be formed. This evaporated layer is twice as thick as the lead pattern formed on the device need be. A mask in the shape of the desired first layer lead pattern is then formed on the thick aluminum layer and anodization is begun. The lead pattern is defined by anodizing the unmasked portions of the aluminum layer all the way through to the underlying silicon dioxide or dielectric surface. Then the lead pattern mask is removed, the surface is masked to protect the contact areas to the first lead interconnect pattern and anodization again proceeds until the remaining unanodized portions of the layer which form the lead pattern have been anodized part way through their thickness. Then, a second layer of aluminum is evaporated onto the device and this layer is covered with a mask defining the second layer interconnect pattern. Anodization of this second layer then follows to define the second layer interconnect pattern. An additional layer of aluminum can then be placed on the circuit and completely anodized to protect this second layer interconnect pattern. Using this process, the number of evaporation steps necessary to form a multilayer semiconductor device is reduced by one or two. Alternatively, the second layer can be thick enough to provide both a second interconnect pattern and a scratch protection layer.

Using the techniques disclosed above, multi-layer interconnect patterns of aluminum were successfully defined on integrated circuits containing diffusion-isolated bipolar devices. The different layers of interconnect patterns were separated by anodized aluminum. Analysis of these integrated circuits revealed that the anodized aluminum in the field of the circuit was slightly higher than the unanodized aluminum in the leads. The elevation difference was small. Thus the process is essentially a planar process. A "soft or porous" anodization results in almost any desired thickness of anodized aluminum. "Soft or porous" anodizing solutions are characterized by their ability to dissolve the anodized aluminum. Therefore, the resulting thickness of anodized aluminum depends on the relative rates of anodization and dissolution. If the anodizing solution does not dissolve any of the anodized aluminum, as in a hard or non-porous anodization, the thickness of the anodized layer will be about 1½ times the thickness of the original aluminum. On the other hand, if the anodization solution dissolves the anodized aluminum as rapidly as it is formed then, of course, no anodized aluminum remains in the field. To obtain a planar structure, the temperature, voltage and acid concentration of the anodizing process must be chosen so as to convert the original aluminum into the same thickness of anodized aluminum. An anodization carried out at 52 volts, with an anodization current of 60 milliamps per wafer (2″ in diameter) in a 4% phosphoric acid solution at 24° C. temperature, with an aluminum layer approximately one (1) micron thick, yielded a substantially planar anodized aluminum surface relative to the unanodized portions of the aluminum layer.

What is claimed is:

1. The method of anodizing a metal layer formed on a semiconductor substrate which comprises:

insulating the backside and edges of the substrates;

masking those portions of the metal layer not to be anodized leaving exposed those parts of the metal layer to be anodized;

placing said metal layer and semiconductor substrate into an anodizing solution;

connecting the metal layer and the substrate to one terminal of a source of electrical potential;

inserting a shunt of a conductive material into said anodizing solution and connecting said conductive material across the terminals of said source of selected potential, said conductive material thereby reducing the overanodization of said metal layer and semiconductor substrate once the exposed parts of the metal layer have been completely anodized but prior to the removal of said metal layer and semiconductor substrate from said anodizing solution;

placing a cathode connected to the other terminal of said source of electrical potential into said anodizing solution; and applying an anodizing voltage from said source of electrical potential to said substrate and metal layer to selectively anodize the selected portions of said metal layer;

said anodizing solution and said anodizing voltage being selected such that upon completion of the anodization the surfaces of the anodized portions of said metal layer are in approximately the same plane as the surfaces of the unanodized portions of said metal layer.

2. The method of claim 1 wherein said metal layer to be anodized comprises aluminum and those portions of the aluminum not to be anodized are masked with a selected photoresist.

3. The method of claim 2 wherein said anodizing solution comprises phosphoric acid and said anodization is carried out with an anodization current density of approximately 4–6 milliamps/cm.$^2$.

References Cited

UNITED STATES PATENTS

| | | | |
|---|---|---|---|
| 3,328,272 | 6/1967 | Sandmann et al. | 204—15 |
| 3,414,502 | 12/1968 | Porrata et al. | 204—15 |
| 3,506,887 | 4/1970 | Gutteridge | 204—15 |
| 3,634,203 | 1/1972 | McMahon | 204—15 |
| 3,468,728 | 9/1969 | Martin | 148—187 |
| 3,461,347 | 8/1969 | Lemelson | 317—101 |
| 3,337,426 | 8/1967 | Celto | 204—15 |
| 3,492,174 | 1/1970 | Nakamura et al. | 148—175 |

OTHER REFERENCES

Electronics, July 20, 1970, p. 33.

Lester Spencer: "Anodized Coatings on Aluminum—A Review," Metal Finishing, March 1969, pp. 53–59.

GERALD L. KAPLAN, Primary Examiner

T. TUFARIELLO, Assistant Examiner

U.S. Cl. X.R.

204—40, 58, 231; 317—234 R